United States Patent [19]

Knoedl, Jr.

[11] Patent Number: 4,607,173

[45] Date of Patent: Aug. 19, 1986

[54] DUAL-CLOCK EDGE TRIGGERED FLIP-FLOP CIRCUITS

[75] Inventor: George Knoedl, Jr., Mt. Pleasant, N.J.

[73] Assignee: AT&T Bell Laboratories, Murray Hill, N.J.

[21] Appl. No.: 589,991

[22] Filed: Mar. 14, 1984

[51] Int. Cl.⁴ .............................................. H03K 3/037
[52] U.S. Cl. ..................................... 307/291; 307/289
[58] Field of Search ................. 307/289, 291; 365/154

[56] References Cited

U.S. PATENT DOCUMENTS

| | | | |
|---|---|---|---|
| 3,467,839 | 9/1969 | Miller | 307/289 |
| 3,967,206 | 6/1976 | Roberson et al. | 307/289 |
| 3,989,960 | 11/1976 | Kodama | 307/247 A |
| 4,072,869 | 2/1978 | Gillow | 307/291 |

OTHER PUBLICATIONS

Kershaw, John D., *Digital Electronics:* Logic and Systems, Duxbury Press, (1976, p. 197).
"TTL Data Book," Fairchild Semiconductor, Inc., pp. 4–144 and 145.

*Primary Examiner*—John Zazworsky
*Attorney, Agent, or Firm*—John K. Mullarney; Daniel D. Dubosky

[57] ABSTRACT

A dual-clock, edge triggered, flip-flop circuit wherein one set of outputs responds to two independent inputs without giving rise to indeterminate states regardless of the combination of inputs comprising a first pair of gates (1-2 or 11-12) cross-coupled to form a first trigger flip-flop. A second pair of gates (7-8 or 17-18) are cross-coupled to form a second trigger flip-flop. A third pair of gates (4-5 or 14-15) are cross-coupled to form an output flip-flop having set and reset terminals and a pair of output terminals. A gate (3 or 13) is coupled from the output of the first trigger flip-flop to the set terminal of the output flip-flop, the input to the first trigger flip-flop also being coupled to the input of this latter gate. Another gate (6 or 16) is coupled from the output of the second trigger flip-flop to the reset terminal of the output flip-flop, the input to the second trigger flip-flop also being coupled to the input of this gate. Each output terminal is cross-coupled back to the input of a respective one of the trigger flip-flops to "disarm", or reset, the same after the output flip-flop has changed state.

10 Claims, 8 Drawing Figures

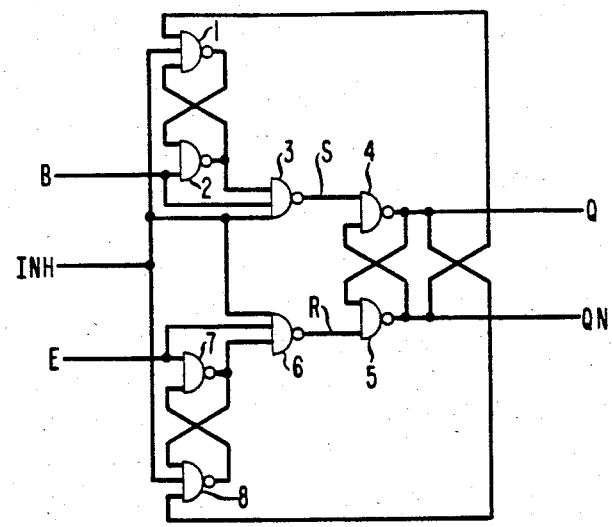

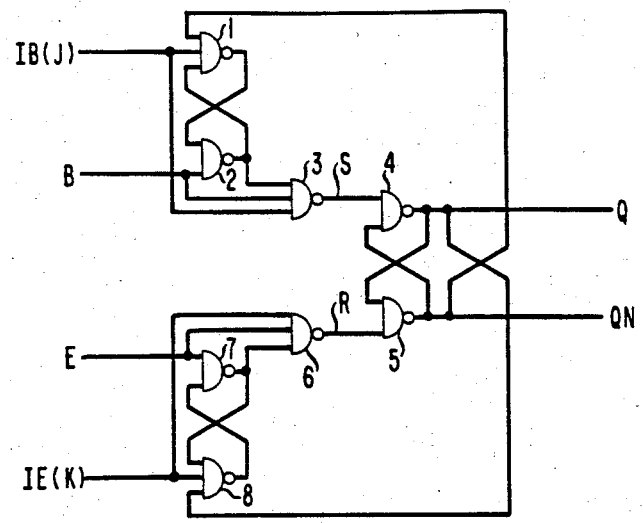

DUAL-CLOCK EDGE TRIGGERED FLIP-FLOP CIRCUITS

TECHNICAL FIELD

This invention relates to flip-flop circuitry wherein one set of outputs responds to two independent inputs without giving rise to indeterminate states—regardless of the combination of inputs.

BACKGROUND OF THE INVENTION

It is known that a set/reset flip-flop comprised of cross-coupled gates (e.g., NAND or NOR gates) may be used to alter its state in response to each of two inputs. However, the ability of the prior art set/reset flip-flop(s) to respond to one of its inputs is typically dependent upon the state of the other of its inputs. If the wrong combination of input states occurs, the subsequent output state may be indeterminate.

SUMMARY OF THE INVENTION

A dual-clock flip-flop in accordance with the present invention responds to two independent inputs, in an edge triggered fashion, without giving rise to indeterminate states. A low to high transition at a first one of the two inputs, while the other is held in either state, will set the flip-flop or leave it set, regardless of the state of the other input. Similarly, a low to high transition at the second input, while the first is held in either state, will reset the flip-flop or leave it reset, regardless of the state of the first input. A high to low transition at either or both inputs will not alter the state of the flip-flop.

This dual-clock flip-flop comprises a first pair of NAND gates cross-coupled to form a first trigger flip-flop. A second pair of NAND gates are cross-coupled to form a second trigger flip-flop. And, a third pair of NAND gates are cross-coupled to form an output flip-flop having set and reset input terminals and a pair of output terminals. A NAND gate is coupled from the output of the first trigger flip-flop to the set terminal of the output flip-flop, the input to the first trigger flip-flop also being coupled to the input of this NAND gate. Another NAND gate is coupled from the output of the second trigger flip-flop to the reset terminal of the output flip-flop, the input to the second trigger flip-flop also being coupled to this last-mentioned NAND gate. Each output terminal of the output flip-flop is cross-coupled back to the input of a respective one of said trigger flip-flops to "disarm", or reset, the same after the output flip-flop has changed state.

In another alternative embodiment of the invention NOR gates are connected in the same manner as the aforementioned NAND gates and the output flip-flop is set and reset in response to input high to low transitions.

The principles of the present invention may be generally applied, including to multiple state circuits with a corresponding number of inputs rendering each edge triggered, and, moreover, all circuits can be readily implemented in traditional AND/OR logic.

BRIEF DESCRIPTION OF THE DRAWING

The invention will be more fully appreciated from the following detailed description when the same is considered in connection with the accompanying drawings, in which:

FIG. 1 is a schematic diagram of a dual-clock flip-flop made up of NAND gates in accordance with the present invention;

FIG. 2 is a truth table useful in understanding the operation of the circuit of FIG. 1;

FIG. 3 shows a modification of the flip-flop circuit of FIG. 1;

FIG. 4 is a truth table useful in understanding the operation of the circuit of FIG. 3;

DETAILED DESCRIPTION

Figure 5:
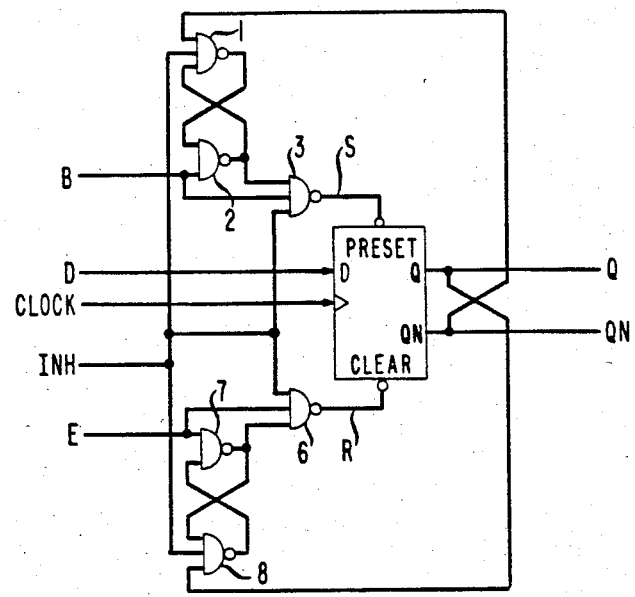
FIG. 5 illustrates the application of the present technique to a conventional "D-type" flip-flop.

FIG. 1 of the drawings shows a dual-clock bistable (flip-flop) circuit in accordance with the present invention. Because of the nature of its behavior, this circuit is called a Start-Stop or Begin-End flip-flop, one function of which is to produce a pulse that will precisely demark the time difference between two events. No indeterminate states arise from any combination of inputs.

An internal S-R (set/reset) flip-flop is comprised of two NAND gates 4 and 5 cross-coupled in conventional fashion; this flip-flop can be considered the output (flip-flop) stage. The NAND gates 1 and 2 and the NAND gates 7 and 8 are similarly cross-coupled to provide first (B) and second (E) trigger flip-flops. The NAND gates 1, 2 and 3 and NAND gates 6, 7 and 8 are connected, as shown, to provide first (B) and second (E) trigger circuits. The IHN (inhibit) and the B and E inputs are applied to the gates, as shown, and the gates are interconnected to provide the following (gate descriptive) mode of operation.

A low to high transition at either the B or E input will provide a negative pulse at the S or R input, respectively, of the internal S-R flip-flop, gates 4 and 5. The negative pulse will be produced only for as long as is necessary and if, and only if, it is necessary to toggle the S-R flip-flop to the intended state.

The B and E trigger circuits, gates 1, 2 and 3, and gates 6, 7 and 8, respectively, are configured such that for any given state of output and inputs (except for an indeterminate wakeup state), the outputs of gates 3 and 6 will be high permitting a stable state of the Q and QN outputs.

A truth table is shown in FIG. 2, which explains the operation of the circuit of FIG. 1. The symbols for the low to high and high to low transitions of the B and E inputs are self-evident. The Xs in the table represent "don't care" conditions. In the last row INH=0), the B and E inputs can be either low to high or high to low transitions, at the same or different times, but the inhibit input (INH=0) renders the flip-flop circuit totally insensitive to any transitions of the B and E inputs. The $Q_n$ column shows the Q output at time n for the specified B, E and INH inputs. The symbol $Q_{n-1}$ indicates the preceding state of (no change to) the Q output. When $Q_n = Q_{n-1}$, the state of the output flip-flop is unchanged.

Assume, for purposes of explanation, that the Inhibit input is high, the Q output low, the QN output high, and the E input in either state, when the B input is brought low the B trigger flip-flop (gates 1 and 2) is "armed", i.e., the output of gate 2 goes high. When the B input returns high the B trigger circuit produces a negative pulse at the output of gate 3, thus setting the S-R flip-flop. The output of gate 3 will remain low until the QN output goes low. When QN goes low it disarms the B trigger flip-flop, returning the output of gate 3 high.

If the B input is brought low again with the QN output low and the Q output high, the B trigger flip-flop will not be armed. Therefore, a subsequent low to high transition of the B input cannot produce a negative pulse at the output of gate 3 and the state of the internal S-R flip-flop will not be altered, i.e., it will remain set.

If the E input is brought low after the S-R flip-flop was set or if it was low when the S-R flip-flop was set by the low to high transition at the B input, the subsequent high state at the Q output would cause the E trigger flip-flop, (gates 7 and 8) to become armed. Upon the next low to high transition of the E input, the E trigger circuit would produce a negative pulse at the output of gate 6 thus resetting the internal S-R flip-flop. As before, the negative pulse would remain until the Q output went low, disarming the E trigger flip-flop.

The circuit is obviously symmetrical and, as such, any description of responses to the B input applies equally for the E input and vice versa.

Figure 7:
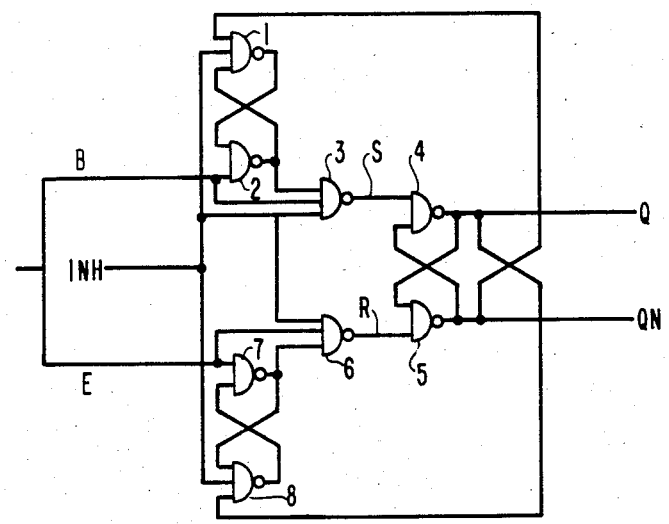
FIGS. 7 and 8 show other modifications of the flip-flop circuit of FIG. 1.

As a by-product of the described function, if the B and E inputs are connected as in FIG. 7 and pulsed together, each time a low to high transition occurs at the inputs, the output state of the internal S-R flip-flop will toggle. This will occur because only the trigger flip-flop driving the output gate whose output is low can be armed.

For example, if the Q output is high and the QN output is low, gate 1 of the B trigger flip-flop is inhibited by the low input from the QN output. The B trigger flip-flop therefore cannot be armed. Gate 8 of the E trigger flip-flop is enabled by the high input from the Q output. The E trigger flip-flop therefore can be armed. Upon simultaneous low to high transition of the B and E inputs a negative pulse appears at the output of gate 6 and the S-R flip-flop is reset in the usual fashion. Due to propagation delay, the output of gate 2 will not return low until after the B input goes high causing the output of gate 3 to start low. However, since the outer input to gate 4 is already low, this has no effect. The S-R flip-flop can be guaranteed to toggle so long as the propagation delay of either gate 2 or 7 does not exceed the combined delay of any two other gates. This may be easily realized in integrated circuitry and is not an unreasonable constraint for discrete circuitry.

To ensure against an unwanted "glitch" at the output of gate 3 or 6, due to the aforementioned propagation delay, the feedback from the output terminals of the S-R flip-flop to the trigger flip-flops (1-2 and 7-8) may also be coupled to the gates 3 and 6, as shown by lines G and H respectively in FIG. 1.

An Inhibit input renders the flip-flop totally insensitive to any transitions of the B and E inputs. While the inhibit input is held low, the B and E inputs may make any combination and number of transitions without altering the state of the internal S-R flip-flop. When the inhibit input is returned high the output state will not be altered, regardless of the previous or final state of the B and E inputs. Separation of the Inhibit inputs into IB and IE inputs as shown in FIG. 3 permits independent control over the B and E inputs. As a further by-product of the intended function, if the B and E inputs are connected as in FIG. 7 and toggled together, the IB and IE inputs behave like the J and K inputs, respectively, of an edge triggered J-K flip-flop, while the common B and E inputs act as the clock input. That this is true may be seen from the accompanying truth table shown in FIG. 4. And, while the function may be similar, the circuit in accordance with the present invention requires fewer gates than the state-of-the-art J-K flip-flop.

Adding another input connection to each of gates 1, 3 and 5 and bringing these additional connections out on a common lead (not shown) will provide an asynchronous clear function. Similarly, adding another input connection to each of gates 4, 6 and 8 and bringing these additional connections out on a common lead will provide an asynchronous preset function.

The technique of the present invention may be generally applied, including to multiple state circuits with a corresponding number of inputs. FIG. 5 shows this technique applied to the asynchronous preset and clear inputs of a conventional D type flip-flop, rendering them edge triggered.

Figure 6:
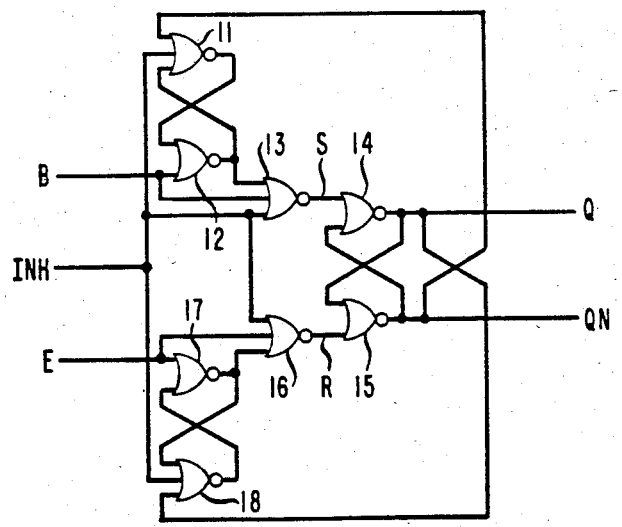
FIG. 6 is a schematic diagram of a dual-clock flip-flop circuit made up of NOR gates.

FIG. 6 illustrates a circuit of the invention made up of NOR gates. This is the "dual" of the NAND gate implementation of FIG. 1. In this instance, however, the internal S-R flip-flop 14 and 15 is set and reset in response to input high to low transitions. Each of the logical states in this circuit is the complement of that described for the NAND gate implementation.

It is to be understood that while the present invention has been described by reference to particular embodiments thereof numerous modifications and alterations may be made by those skilled in the art without departing from the spirit and scope of the invention.

What is claimed is:

1. In a circuit wherein one set of outputs responds to two independent inputs without giving rise to indeterminate states, the combination comprising an output flip-flop having set and reset terminals and a pair of output terminals, a first pair of gates cross-coupled to form a first trigger flip-flop, said first trigger flip-flop having first and second inputs and an output; a second pair of gates cross-coupled to form a second trigger flip-flop, said second trigger flip-flop having first and second inputs and an output; a first gate having an input, said first gate being coupled from the output of the first trigger flip-flop to the set terminal of the output flipflop, the first input of the first trigger flip-flop also being coupled to the input of said first gate; a second gate having an input, said second gate being coupled from the output of the second trigger flip-flop to the reset terminal of the output flip-flop, the first input of the second trigger flip-flop also being coupled to the input of said second gate; and feedback means cross-coupling each output terminal to the second input of a respective one of said trigger flip-flops to disarm the same after the output flip-flop has changed state.

2. A dual-clock, edge triggered flip-flop circuit comprising a first pair of gates cross-coupled to form a first trigger flip-flop, said first trigger flip-flop having first and second inputs and an output;

a second pair of gates cross-coupled to form a second trigger flip-flop, said second trigger flip-flop having first and second inputs and an output;

a third pair of gates cross-coupled to form an output flip-flop having set and reset input terminals and a pair of output terminals;

a first gate having an input, said first gate being coupled from the output of the first trigger flipflop to the set terminal of the output flip-flop, the first input of the first trigger flip-flop also being coupled to the input of this first gate;

a second gate having an input, said second gate being coupled from the output of the second trigger flip-flop to the reset terminal of the output flip-flop, the first input of the second trigger flip-flop also being coupled to the input of this second gate;

feedback means cross-coupling each output terminal to the second input of a respective one of said trigger flip-flops to disarm the same after the output flip-flop has changed state.

3. A flip-flop circuit as defined in claim 2 wherein said gates comprise NAND gates.

4. A flip-flop circuit as defined in claim 2 wherein said gates comprise NOR gates.

5. A flip-flop circuit as defined in claim 2 wherein said feedback means is also cross-coupled to the first and second gates which are coupled to the respective outputs of said trigger flip-flops to inhibit unwanted output signals from these first and second gates.

6. A flip-flop circuit as defined in claim 2 including means for coupling an inhibit signal to said first and second trigger flip-flops and to the first and second gates which are coupled to the respective outputs of said trigger flip-flops to render said flip-flop circuit insensitive to transitions in any input signals applied thereto.

7. A flip-flop circuit as defined in claim 6 wherein separate means are provided for coupling an inhibit signal to the first and to the second trigger flip-flops and to the associated first and second gates coupled thereto.

8. A flip-flop circuit as defined in claim 7 wherein the first input of said first trigger flip-flop is connected to the first input of said second trigger flip-flop so that said trigger flip-flops are toggled together to provide an edge triggered J-K flip-flop type function.

9. An edge triggering circuit having a trigger output terminal and clock and disarm input terminals, whose output state is responsive once only to an edge at said clock input terminal and will remain unchanged until reset by a signal at the disarm input terminal, comprising a pair of gates cross-coupled to form a trigger flip-flop having an output terminal and set and reset input terminals comprising the clock and disarm input terminals respectively of the edge triggering circuit; and a subsequent gate having at least three inputs and an output, a first one of said at least three inputs of said subsequent gate being connected to the output terminal of said trigger flip-flop and the output of said subsequent gate comprising the trigger output terminal of said edge triggering circuit, the clock input terminal of said edge triggering circuit also being connected to a second one of said at least three inputs of said subsequent gate, and the disarm input terminal also being connected to a third one of said at least three inputs of said subsequent gate.

10. The edge triggering circuit of claim 9 including means for coupling an inhibit signal to said trigger flip-flop and to said subsequent gate to render said edge triggering circuit insensitive to transitions at the clock input terminal.

* * * * *

UNITED STATES PATENT AND TRADEMARK OFFICE
CERTIFICATE OF CORRECTION

PATENT NO. : 4,607,173

DATED : August 19, 1986

INVENTOR(S) : George Knoedl, Jr.

Figure 8:
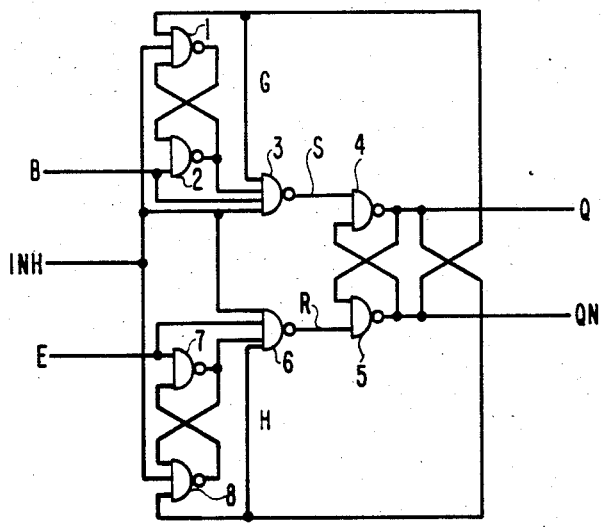

It is certified that error appears in the above—identified patent and that said Letters Patent is hereby corrected as shown below:

Column 2, line 33, "IHN" should read --INH--.
Column 3, line 42, "outer" should read --other--.
Column 3, line 54, "FIG. 1" should read --FIG. 8--.

Signed and Sealed this

Ninth Day of December, 1986

*Attest:*

DONALD J. QUIGG

*Attesting Officer*     *Commissioner of Patents and Trademarks*